United States Patent
Kim et al.

(10) Patent No.: US 11,067,856 B2
(45) Date of Patent: Jul. 20, 2021

(54) METHOD OF MANUFACTURING IMPACT RESISTANT DISPLAY APPARATUS

(71) Applicant: SAMSUNG DISPLAY CO., LTD., Yongin-si (KR)

(72) Inventors: Hyoengki Kim, Yongin-si (KR); Sangwook Sin, Yongin-si (KR); Jaeyoung Shin, Yongin-si (KR); Seungjoon Yoo, Yongin-si (KR); Jaeman Lee, Yongin-si (KR); Hyunsoo Lee, Yongin-si (KR); Beomjun Cheon, Yongin-si (KR); Gwangjoon Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/865,198

(22) Filed: May 1, 2020

(65) Prior Publication Data
US 2020/0257148 A1     Aug. 13, 2020

Related U.S. Application Data

(62) Division of application No. 15/003,462, filed on Jan. 21, 2016, now Pat. No. 10,678,098.

(30) Foreign Application Priority Data

Apr. 15, 2015  (KR) .................... 10-2015-0053138

(51) Int. Cl.
*G02F 1/1339*     (2006.01)
*H01L 51/52*      (2006.01)
*G02F 1/1333*     (2006.01)

(52) U.S. Cl.
CPC ...... *G02F 1/1339* (2013.01); *G02F 1/133351* (2013.01); *H01L 51/52* (2013.01);
(Continued)

(58) Field of Classification Search
CPC ............ G02F 1/1339; G02F 1/133351; H01L 51/5246; H01L 51/52; H01L 51/524
See application file for complete search history.

(56) References Cited

U.S. PATENT DOCUMENTS

| | | |
|---|---|---|
| 7,646,466 B2 | 1/2010 | Hashimoto |
| 7,780,493 B2 | 8/2010 | Choi et al. |
| (Continued) | | |

FOREIGN PATENT DOCUMENTS

| | | |
|---|---|---|
| CN | 101221910 A | 7/2008 |
| CN | 101645403 A | 2/2010 |
| (Continued) | | |

OTHER PUBLICATIONS

U.S. Office action dated May 1, 2019, issued in U.S. Appl. No. 15/997,650 (12 pages).

(Continued)

*Primary Examiner* — Thao X Le
*Assistant Examiner* — Gardner W. S. Swan
(74) *Attorney, Agent, or Firm* — Lewis Roca Rothgerber Christie LLP

(57) ABSTRACT

A display apparatus comprises a first substrate comprising a first external surface and a first internal surface; a second substrate having a second external surface and a second internal surface facing the first internal surface of the first substrate; and a display unit disposed between the first and second substrates and comprising an array of pixels. The first substrate comprises a first side connecting the first external surface and the first internal surface. In a cross section perpendicular to the first external surface, the first side comprises a first straight region and a first curved region located between the straight region and the first internal surface. The second substrate comprises a second side connecting the first external surface and the first internal (Continued)

surface. The second side comprises a second straight region and a second curved region located between the straight region and the second internal surface.

13 Claims, 9 Drawing Sheets

(52) U.S. Cl.
CPC ........ *H01L 51/524* (2013.01); *H01L 51/5246* (2013.01); *G02F 2001/133302* (2013.01); *G02F 2201/503* (2013.01); *H01L 2251/566* (2013.01)

(56) References Cited

U.S. PATENT DOCUMENTS

| | | | |
|---|---|---|---|
| 8,233,129 | B2 | 7/2012 | Sasaki et al. |
| 8,292,684 | B2 | 10/2012 | Kim et al. |
| 9,349,969 | B2 | 5/2016 | Kwon et al. |
| 9,422,184 | B2 | 8/2016 | Fujii et al. |
| 9,445,518 | B2 | 9/2016 | Yoon et al. |
| 9,530,981 | B2 | 12/2016 | Koo |
| 2002/0131008 | A1 | 9/2002 | Iwase et al. |
| 2004/0056585 | A1 | 3/2004 | Suzuki et al. |
| 2007/0176550 | A1 | 8/2007 | Kwan |
| 2009/0290113 | A1 | 11/2009 | Nakahata et al. |
| 2010/0315374 | A1* | 12/2010 | Chen .................. G06F 3/044 345/174 |
| 2010/0327737 | A1 | 12/2010 | Hayashi et al. |
| 2011/0050657 | A1 | 3/2011 | Yamada |
| 2011/0057892 | A1 | 3/2011 | Kwak et al. |
| 2011/0194063 | A1 | 8/2011 | Lee et al. |
| 2012/0006466 | A1* | 1/2012 | Galstian ................ G02F 1/1341 156/146 |
| 2012/0044450 | A1 | 2/2012 | Kurosaki et al. |
| 2012/0075823 | A1 | 3/2012 | Park et al. |
| 2012/0248950 | A1 | 10/2012 | Niibori |
| 2012/0267660 | A1 | 10/2012 | Han et al. |
| 2012/0267760 | A1 | 10/2012 | Su et al. |
| 2012/0287026 | A1 | 11/2012 | Masuda |
| 2013/0308075 | A1 | 11/2013 | Watanabe |
| 2014/0016253 | A1 | 1/2014 | Lee et al. |
| 2014/0063407 | A1 | 3/2014 | Kwon et al. |
| 2014/0307407 | A1 | 10/2014 | Han |
| 2014/0339574 | A1 | 11/2014 | Kang et al. |
| 2015/0034981 | A1 | 2/2015 | Tamagawa et al. |
| 2015/0084055 | A1 | 3/2015 | Nagata et al. |
| 2015/0236292 | A1 | 8/2015 | Sato et al. |
| 2016/0099435 | A1 | 4/2016 | Yang et al. |
| 2016/0111485 | A1 | 4/2016 | Chida |
| 2016/0204183 | A1 | 7/2016 | Tao et al. |

FOREIGN PATENT DOCUMENTS

| | | |
|---|---|---|
| CN | 102437171 A | 5/2012 |
| CN | 103619765 A | 3/2014 |
| CN | 103819082 A | 5/2014 |
| CN | 104181734 A | 12/2014 |
| CN | 104317080 A | 1/2015 |
| JP | 8-220559 A | 8/1996 |
| JP | 2008-96836 A | 4/2008 |
| JP | 2011-107556 A | 6/2011 |
| KR | 10-2009-0092240 A | 8/2009 |
| KR | 10-2011-0025375 A | 3/2011 |
| KR | 10-2012-0018978 A | 3/2012 |
| KR | 10-2012-0049707 A | 5/2012 |
| KR | 10-2014-0028776 A | 3/2014 |
| KR | 10-2014-0035755 A | 3/2014 |
| KR | 10-2014-0123778 A | 10/2014 |
| KR | 10-2015-0097853 A | 8/2015 |
| TW | 201423208 A | 6/2014 |
| WO | WO 2012/011268 A1 | 1/2012 |

OTHER PUBLICATIONS

U.S. Office Action dated Jan. 25, 2021, issued in U.S. Appl. No. 16/696,542 (8 pages).

Chinese Office Action dated Jun. 2, 2021, issued in corresponding Chinese Patent Application No. 201610230620.3 (10 pages).

* cited by examiner

METHOD OF MANUFACTURING IMPACT RESISTANT DISPLAY APPARATUS

CROSS-REFERENCE TO RELATED APPLICATIONS

This application is a divisional of U.S. patent application Ser. No. 15/003,462, filed Jan. 21, 2016, which claims priority to and the benefit of Korean Patent Application No. 10-2015-0053138, filed Apr. 15, 2015, the entire content of both of which is incorporated herein by reference.

BACKGROUND

1. Field

One or more embodiments relate to a display apparatus and a method of manufacturing the same, and more particularly, to a display apparatus that is easily manufactured and has increased impact resistance, and a method of manufacturing the display apparatus.

2. Discussion of the Related Technology

Studies are actively being conducted on a display apparatus, such as an organic light-emitting display apparatus or a liquid crystal display apparatus, since the display apparatus is thin and flexible. The display apparatus may have a structure in which a first substrate, on which a display unit is formed, is combined to a second substrate by using an encapsulation member, with the display unit interposed between the first and second substrates.

However, an external impact may easily damage the first substrate and/or the second substrate of the display apparatus having such a structure.

SUMMARY

One or more embodiments include a display apparatus that is easily manufactured and has increased impact resistance, and a method of manufacturing the display apparatus.

One aspect of the invention provides a display apparatus, which may comprise: a first substrate comprising a first external surface and a first internal surface; a second substrate having a second external surface and a second internal surface facing the first internal surface of the first substrate; and a display unit disposed between the first and second substrates and comprising an array of pixels, wherein the first substrate comprises a first side connecting the first external surface and the first internal surface, wherein, in a cross section perpendicular to the first external surface, the first side comprises a first straight region and a first curved region located between the first straight region and the first internal surface, wherein the second substrate comprises a second side connecting the second external surface and the second internal surface, wherein, in the cross section, the second side comprises a second straight region and a second curved region located between the second straight region and the second internal surface.

In the foregoing apparatus, the apparatus may further comprise an adhesive member disposed between the first internal surface and the second internal surface and combining the first and second substrates together. The adhesive member may comprise an outer side surface and an inner side surface which are curved, wherein a radius of curvature of the inner side surface is less than a radius of curvature of the outer side surface. The adhesive member may comprise an outer side surface which is curved, wherein the first curved region of the first substrate, the outer side surface of the adhesive member, and the second curved region of the second substrate may form a convex surface. In the cross section, the convex surface may have a continuously curved feature.

Still in the foregoing apparatus, the first straight region of the first substrate may be substantially perpendicular to the first external surface of the first substrate. The second straight region of the second substrate may be substantially perpendicular to the second external surface of the second substrate. The apparatus may further comprise a film covering the first external surface while not covering the first side of the first substrate.

Another aspect of the invention provides a method of manufacturing a display apparatus, which may comprise: providing an intermediate product comprising: a first substrate comprising a first external surface and a first internal surface; a second substrate comprising a second external surface and a second internal surface; a display unit comprising an array of pixels disposed between the first substrate and the second substrate; and an adhesive member located between the first internal surface of the first substrate and the second internal surface of the second substrate to surround the display unit and combining the first and second substrates together; and cutting the intermediate product to make a final product, wherein, in the final product, the first substrate comprises a first side connecting the first external surface and the first internal surface, wherein, in a cross section perpendicular to the first external surface, the first side comprises a first straight region and a first curved region located between the first straight region and the first internal surface, and further such that the second substrate comprises a second side connecting the second external surface and the second internal surface, wherein, in the cross section, the second side comprises a second straight region and a second curved region located between the second straight region and the second internal surface.

In the foregoing method, the method may further comprise irradiating light beams to a part of the adhesive member such that after curing the adhesive member, the adhesive member comprises a cured portion and an uncured portion, the cured portion being disposed between the display unit and the uncured portion. Cutting may comprise moving a first cutter to contact the first substrate at a first cutting point on the first external surface, the first cutting point being located between an outermost end of the cured portion and the display unit when viewed in a viewing direction perpendicular to the first external surface. When a center of the cured portion is defined between the outermost end and an innermost end of the cured portion, the first cutting point may be located between the outermost end and the center of the cured portion. Cutting may further comprise advancing the first cutter in a thickness direction of the first substrate toward the first internal surface only by a first distance which is smaller than a thickness of the first substrate, wherein a remaining portion of the first substrate is cut without further advancing the first cutter in the thickness direction of the first substrate toward the first internal surface.

Still in the foregoing method, cutting may further comprise moving a second cutter to contact the second substrate at a second cutting point on the second external surface, the second cutting point being located between the outermost end of the cured portion and the display unit when viewed in a viewing direction perpendicular to the first external surface. Cutting may further comprise advancing the first cutter in a thickness direction of the first substrate toward the first internal surface only a first distance which is smaller than a thickness of the first substrate, and advancing the second cutter in a thickness direction of the second substrate toward the second internal surface only a second distance which is smaller than a thickness of the second substrate, wherein remaining portions of the first and second substrates are cut without further advancing the first and second cutters toward the first and second interior surfaces, respectively. The remaining portions of the first and second substrates may be spontaneously cut or the remaining portions of the first and second substrates are cut by applying a force to the first or second substrate. Cutting may further comprise transferring the first cutter along a first predetermined line along the first external surface and transferring the second cutter along a second predetermined line along the second external surface after advancing the first and second cutters, wherein the first and second predetermined lines overlap the cured portion of the adhesive member.

Yet in the foregoing method, the method may further comprise forming a conductive pattern for a touch screen and a blocking pattern over the second external surface of the second substrate, wherein the blocking pattern blocks the light beams not to reach the other part of the adhesive member while irradiating the light beams to form the uncured portion of the adhesive member. The uncured portion of the adhesive member and the blocking pattern may be removed while cutting the intermediate product such that the final product does not comprise the blocking pattern and the uncured portion of the adhesive member. The method may further comprise adhering a film covering at least one of the first external surface of the first substrate and the second external surface of the second substrate while not covering side surfaces of the first substrate and the second substrate.

Additional aspects will be set forth in part in the description which follows and, in part, will be apparent from the description, or may be learned by practice of the presented embodiments.

According to one or more embodiments, a display apparatus includes: a first substrate having a first external surface and a first internal surface; a second substrate having a second external surface and a second internal surface facing the first internal surface of the first substrate; and a display unit disposed between the first and second substrates and including a display device, wherein the first substrate has a first constant region having a uniform width and a first increasing region having an increasing width, in a direction from the first external surface to the first internal surface, and the second substrate has a second constant region having a uniform width and a second increasing region having an increasing width, in a direction from the second external surface to the second internal surface.

The display apparatus may further include a combining member disposed between an edge of the first internal surface and an edge of the second internal surface to combine the first and second substrates together.

A radius of curvature of an inner surface of the combining member in a direction of the display unit may be less than a radius of curvature of an outer surface of the combining member in a direction opposite to the display unit.

A side surface of the first increasing region of the first substrate, an outer surface of the combining member in a direction opposite to the display unit, and a side surface of the second increasing region of the second substrate may form a convex surface. The convex surface may be a continuous surface.

A side surface of the first constant region of the first substrate may be perpendicular to the first external surface of the first substrate.

A side surface of the second constant region of the second substrate may be perpendicular to the second external surface of the second substrate.

The display apparatus may further include a film covering at least one of the first external surface of the first substrate and the second external surface of the second substrate while not covering side surfaces of the first substrate and the second substrate.

According to one or more embodiments, a method of manufacturing a display apparatus, the method includes: preparing a first substrate having a first external surface and a first internal surface; preparing a second substrate having a second external surface and a second internal surface; forming a display unit having a display device, on the first internal surface of the first substrate; locating a combining member between the first internal surface of the first substrate and the second internal surface of the second substrate to surround the display unit and combining the first and second substrates together; and cutting the first and second substrates such that a region of the first substrate, which corresponds to the display unit, has a first constant region having a uniform width and a first increasing region having an increasing width in a direction from the first external surface to the first internal surface, and a region of the second substrate, which corresponds to the display unit, has a second constant region having a uniform width and a second increasing region having an increasing width in a direction from the second external surface to the second internal surface.

The method may further include exposing a part of the combining member in a direction of the display unit or exposing a part of the combining member excluding an edge of the combining member.

The cutting may include start cutting at a cutting point in regions of the first external surface of the first substrate and the second external surface of the second substrate which correspond to the combining member, the cutting point being closer to the display unit than a location between an exposed region of the combining member and an unexposed region of the combining member which is far from the display unit.

When a center of the exposed region of the combining member is a first point, the boundary between the exposed region of the combining member and the unexposed region of the combining member which is far from the display unit, is a second point, and a center between the first and second points is a third point, the cutting point may correspond to the third point, or correspond to a position between the second and third points.

The cutting may include cutting the first and second substrates only up to the first constant region of the first substrate and the second constant region of the second substrate by using a cutting wheel.

The cutting may include simultaneously cutting the first and second substrates inward by making the cutting wheel contact the first external surface of the first substrate and the second external surface of the second substrate.

The cutting may include letting the first increasing region of the first substrate and the second increasing region of the second substrate be self-cut by internal stress.

The method may further include forming a conductive pattern and a blocking pattern for a touch screen, on the second external surface of the second substrate, wherein the exposing may include exposing only a region of the combining member in a direction of the display unit by using the blocking pattern, or exposing a region of the combining member excluding an edge of the combining member.

The cutting may include cutting the first and second substrates such that the blocking pattern is removed.

The method may further include adhering a film covering at least one of the first external surface of the first substrate and the second external surface of the second substrate while not covering side surfaces of the first substrate and the second substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
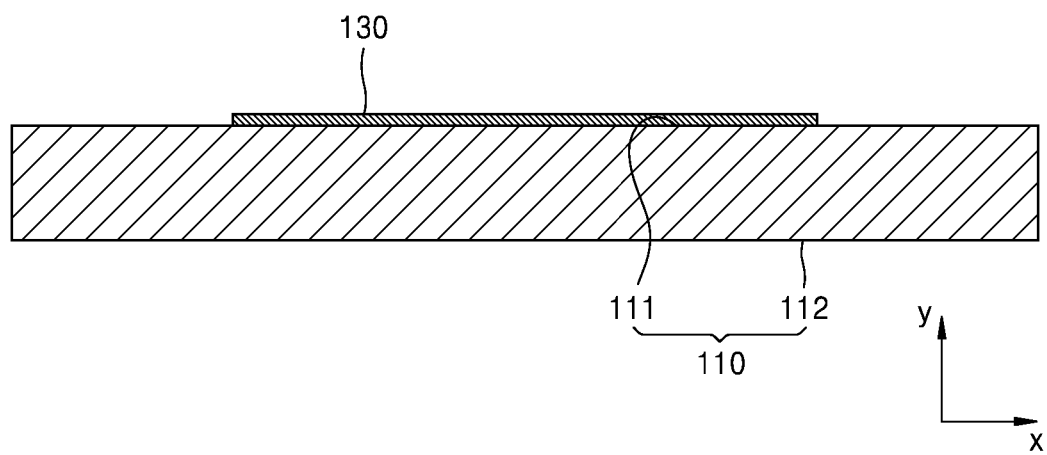
FIGS. 1 through 7 are cross-sectional views for describing processes of a method of manufacturing a display apparatus, according to an embodiment.

Reference will now be made in detail to embodiments, examples of which are illustrated in the accompanying drawings. In this regard, the present embodiments may have different forms and should not be construed as being limited to the descriptions set forth herein. Accordingly, the embodiments are merely described below, by referring to the figures, to explain aspects of the present description.

In drawings, like reference numerals refer to like elements throughout and overlapping descriptions shall not be repeated.

It will be understood that when a layer, region, or component is referred to as being "formed on," another layer, region, or component, it can be directly or indirectly formed on the other layer, region, or component. That is, for example, intervening layers, regions, or components may be present. Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

As used herein, the term "and/or" includes any and all combinations of one or more of the associated listed items. Expressions such as "at least one of," when preceding a list of elements, modify the entire list of elements and do not modify the individual elements of the list.

FIGS. 1 through 7 are cross-sectional views for describing processes of a method of manufacturing a display apparatus, according to an embodiment.

According to the method of the current embodiment, a first substrate 110 is prepared. The first substrate 110 that may be formed of glass has a first internal surface 111 and a first external surface 112, as shown in FIG. 1, and the first external surface 112 may be understood to be an external surface after the first substrate 110 is combined to a second substrate 120 later. Here, a side surface of the first substrate 110 may be understood to be a region connecting the first internal surface 111 to the first external surface 112.

After preparing the first substrate 110 as such, a display unit 130 having a display device is formed on or over the first internal surface 111 of the first substrate 110. The display device may be an organic light-emitting device, a liquid crystal device, or another display device. Of course, a structure of the display unit 130 is not limited thereto, and the display unit 130 may further include an electronic device, such as a thin-film transistor and/or a capacitor.

Meanwhile, the second substrate 120 (refer to FIG. 2) that may be formed of glass is prepared. The second substrate 120 has a second internal surface 121 and a second external surface 122. An order of preparing the first and second substrates 110 and 120 is not limited, for example, the first and second substrates 110 and 120 may be simultaneously prepared or one of the first and second substrates 110 and 120 may be prepared first.

Figure 2:
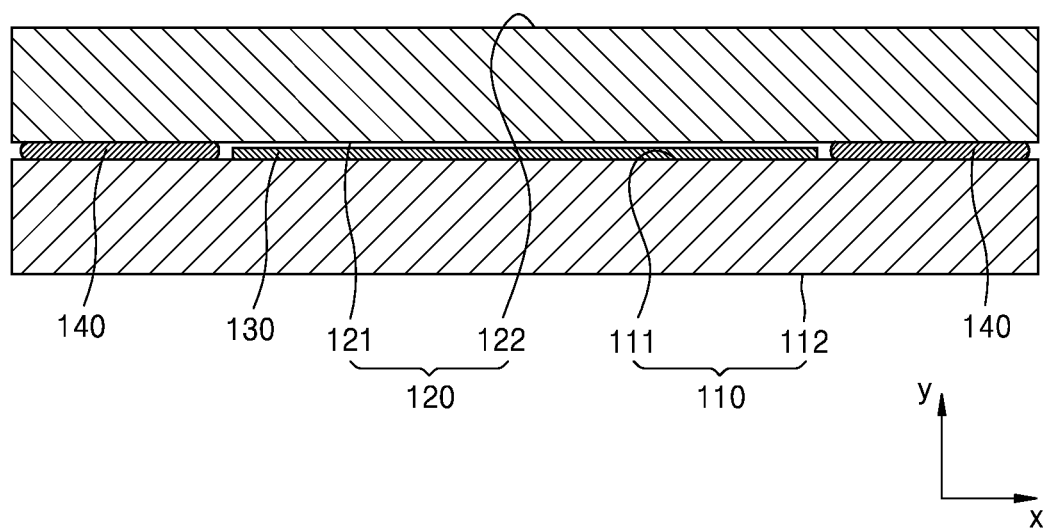

Then, as shown in FIG. 2, a combining or adhesive member 140 is located between the first internal surface 111 of the first substrate 110 and the second internal surface 121 of the second substrate 120 to surround the display unit 130, thereby combining or bonding the first and second substrates 110 and 120. The combining member 140 may have a width of 200 to 800 um and a thickness of 2 to 10 um. The combining or adhesive member 140 may be formed of, for example, frit. Frit is a subsidiary material of a glass raw material, and may be cured after being exposed to a laser beam. Frit may be a composition including 15 to 40 wt % of $V_2O_5$, 10 to 30 wt % of $TeO_2$, 1 to 15 wt % of $P_2O_5$, 1 to 15 wt % of BaO, 1 to 20 wt % of ZnO, 5 to 30 wt % of $ZrO_2$, 5 to 20 wt % of $WO_3$, and 1 to 15 wt % of BaO as main ingredients, and at least one of $Fe_2O_3$, CuO, MnO, $Al_2O_3$, $Na_2O$, and $Nb_2O_5$ as an additive. Frit having such a composition may have a thermal expansion coefficient of 40 to $100 \times 10^{-7}/°$ C. and a glass transition temperature of 250 to 400° C. By using such frit, a region cured later enables the first and second substrate 110 and 120 to have internal stress having a distribution described below such that side surfaces of the first and second substrates 110 and 120 are convex when the first and second substrates 110 and 120 are cut, as described in detail later. In embodiments, the adhesive member 140 may function as a seal member for sealing between the first and second substrates 110 and 120 and protecting the display unit 130 from outside materials or substances, for example, moisture.

The combining member 140 may combine the first and second substrates 110 and 120 together via any one of various methods. For example, the combining member 140 may be located along an edge of the second internal surface 121 of the second substrate 120 and then bond the first and second substrates 110 and 120. Alternatively, the combining member 140 may be located along an edge of the first internal surface 111 of the first substrate 110 around the display unit 130 and then bond the first and second substrates 110 and 120. In any cases, a side surface of the combining member 140 becomes convex as shown in FIG. 2 when the first and second substrates 110 and 120 are bonded, as shown in FIG. 2. In FIG. 2, a side surface of the combining member 140 is convex towards the display unit 130, and the other side surface of the combining member 140 is also convex externally.

Figure 7:
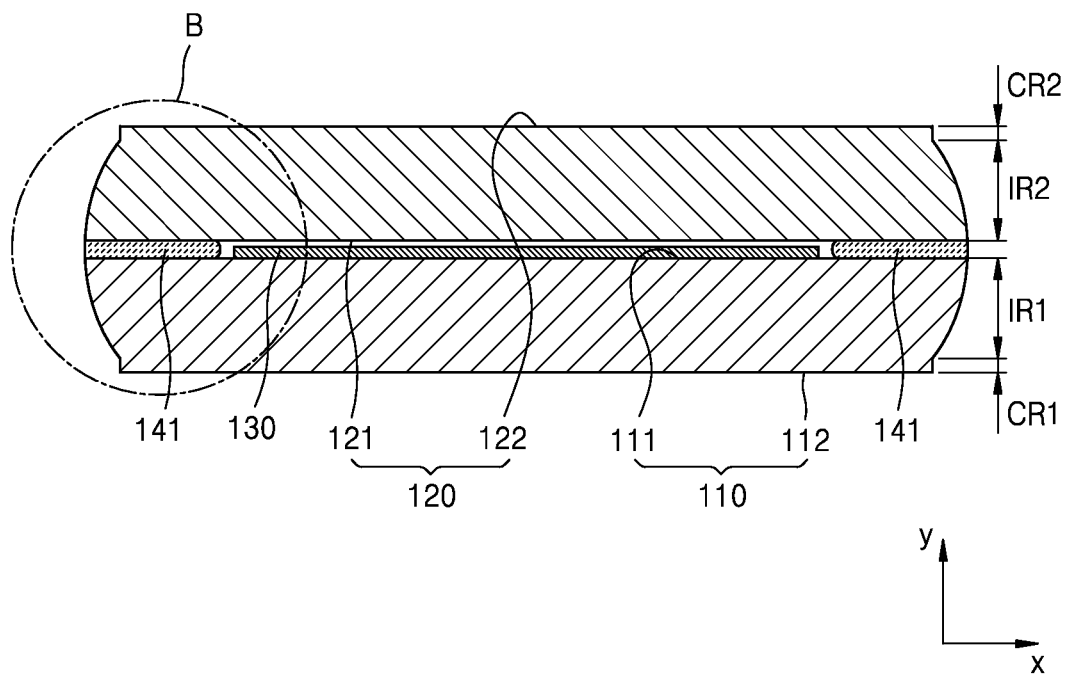

Then, the first and second substrates 110 and 120 are cut to manufacture a display apparatus shown in FIG. 7. Cut shapes of the first and second substrates 110 and 120 will be described in detail with reference to FIG. 7 and FIG. 8 that is an enlarged cross-sectional view of a region B of FIG. 7. When cutting the first and second substrates 110 and 120, the first and second substrates 110 and 120 are cut such that the side surfaces have pre-set shapes.

In the first substrate 110, a region of the first substrate 110, which corresponds to the display unit 130, has a first constant region CR1 having a uniform width and a first increasing region IR1 having an increasing width, in a direction (a +y direction) from the first external surface 112 to the first internal surface 111. Here, a width may be understood to be a length in an x-axis direction in FIGS. 7 and 8. As shown in FIG. 7, a width measured along the x-axis direction between the first constant region CR1 of the right side and the corresponding constant region of the left side is substantially uniform, whereas a width measured along the x-axis direction between the first increasing region IR1 of the right side and the increasing region of the left side is changing. Also, the region corresponding to the display unit 130 may not only includes a region on which the display unit 130 is disposed, but may also include a region corresponding to the combining member 140 (a region 141 of FIGS. 7 and 8). When the first substrate 110 is cut, the side surface of the first substrate 110 may have a first constant side surface 110b that is adjacent to the first external surface 112 and approximately perpendicular to the first external surface 112, and a first increasing side surface 110a that is convex externally in a direction (the +y direction) from the first constant side surface 110b to the first internal surface 111 of the first substrate 110. Here, the first constant side surface 110b is a side surface of the first constant region CR1 of the first substrate 110.

As shown in FIG. 7, in a cross section taken perpendicular to the external surface of the first substrate 110, the first constant region CR1 may be illustrated as a straight portion extending along a thickness direction of the first substrate 110. Further, in the same cross section, the first increasing region IR1 may be illustrated as a convexly curved portion.

In the second substrate 120, a region of the second substrate 120, which corresponds to the display unit 130, has a second constant region CR2 having a uniform width and a second increasing region IR2 having an increasing width, in a direction (a −y direction) from the second external surface 122 to the second internal surface 121. Here, a width may be understood to be a length in an x-axis direction in FIGS. 7 and 8. Also, the region corresponding to the display unit 130 may not only includes a region on which the display unit 130 is disposed, but may also include a region corresponding to the combining member 140 (the region 141 of FIGS. 7 and 8). When the second substrate 120 is cut, the side surface of the second substrate 120 may have a second constant side surface 120b that is adjacent to the second external surface 122 and approximately perpendicular to the second external surface 122, and a second increasing side surface 120a that is convex externally in a direction (the −y direction) from the second constant side surface 120b to the second internal surface 121 of the second substrate 120. Here, the second constant side surface 120b is a side surface of the second constant region CR2 of the second substrate 120.

As shown in FIG. 7, in a cross section taken perpendicular to the external surface of the second substrate 120, the second constant region CR2 may be illustrated as a straight portion extending along a thickness direction of the second substrate 120. Further, in the same cross section, the second increasing region IR2 may be illustrated as a convexly curved portion.

Figure 8:
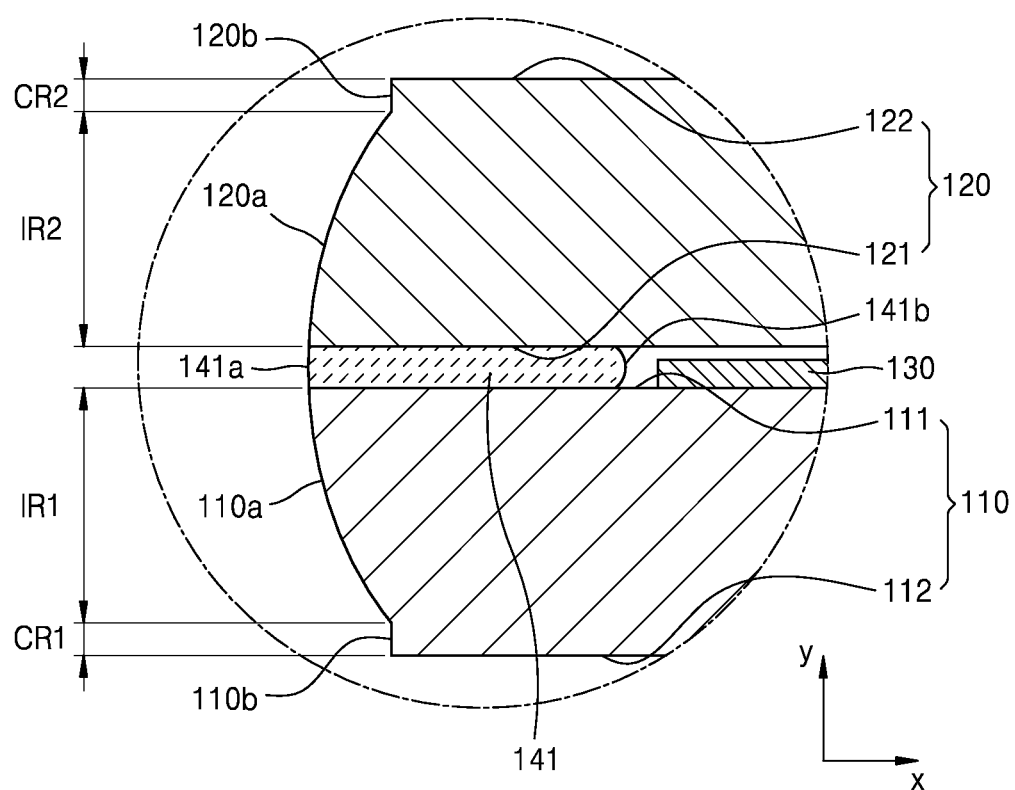
FIG. 8 is an enlarged cross-sectional view of a region B of FIG. 7.

In the display apparatus manufactured according to the method of the current embodiment, a side surface of the display apparatus is convex in overall, as shown in FIGS. 7 and 8. When the side surface of the display apparatus is convex as such, a probability of the side surface of the display apparatus being damaged by an external impact is remarkably low compared to when the side surface of the display apparatus is flat and perpendicular to the first external surface 112 of the first substrate 110 or the second external surface 122 of the second substrate 120, because, when the side surface of the display apparatus is convex, an effect as if the display apparatus has an arch structure is displayed, and thus impact resistance, in detail, strength with respect to a side impact, is increased. Accordingly, the display apparatus having excellent impact resistance is realized.

In embodiments, with respect to a thickness of the first substrate 110 in the +y direction, a region occupied by the first constant region CR1 may be smaller than a region occupied by the first increasing region IR1. For example, with respect to the thickness of the first substrate 110 in the +y direction, the region occupied by the first constant region CR1 may be smaller than or equal to ½ of the region occupied by the first increasing region IR1. Similarly, with respect to a thickness of the second substrate 120 in the +y direction, a region occupied by the second constant region CR2 may be smaller than or equal to ½ of the region occupied by the second increasing region IR2.

Meanwhile, in the display apparatus manufactured according to the method of the current embodiment, the first substrate 110 has the first constant region CR1 in which the region of the first substrate 110, which corresponds to the display unit 130, has the uniform width in the direction (the +y direction) from the first external surface 112 to the first internal surface 111, as shown in FIGS. 7 and 8. Accordingly, in the first constant region CR1, the first external surface 112 and the first constant side surface 110b of the first substrate 110 are approximately perpendicular to each other, and as a result, a boundary is clear between the first external surface 112 and the first constant side surface 110b of the first substrate 110. Accordingly, a region of the first external surface 112 of the first substrate 110 is clear, and thus when a functional film, such as a reflection prevention film, a temporary protection film, or a polarization film, is attached on the first external surface 112 of the first substrate 110, the functional film may cover all of the first external surface 112 while not covering the side surface, i.e., the first constant side surface 110b of the first substrate 110.

If the first substrate 110 does not have the first constant region CR1, the side surface of the first substrate 110 may only include the first increasing side surface 110a that is convex, and not include the first constant side surface 110b. In this case, an angle formed by the first increasing side surface 110a and the first external surface 112 at a region where the first increasing side surface 110a and the first external surface 112 contact each other is obtuse, and thus a boundary in the region where the first increasing side surface 110a and the first external surface 112 contact each other may not be clear. Accordingly, when a film is attached to the first external surface 112, it is difficult to specify an edge of the first external surface 112 where the film is to be attached, and thus the film may not be attached to an accurate location The same is applied to the second substrate 120. In the display apparatus manufactured according to the method of the current embodiment, the second substrate 120 has the second constant region CR2 in which the region of the second substrate 120, which corresponds to the display unit 130, has the uniform width in the direction (the −y direction) from the second external surface 122 to the second internal surface 121, as shown in FIGS. 7 and 8. Accordingly, in the second constant region CR2, the second external surface 122 and the second constant side surface 120b of the second substrate 120 are approximately perpendicular to each other, and as a result, a boundary is clear between the second external surface 122 and the second constant side surface 120b of the second substrate 120. Accordingly, a region of the second external surface 122 of the second substrate 120 is clear, and thus when a functional film, such as a reflection prevention film, a temporary protection film, or a polarization film, is attached on the second external surface 122 of the second substrate 120, the functional film may cover all of the second external surface 122 while not covering the side surface, i.e., the second constant side surface 120b of the second substrate 120.

Figure 3:
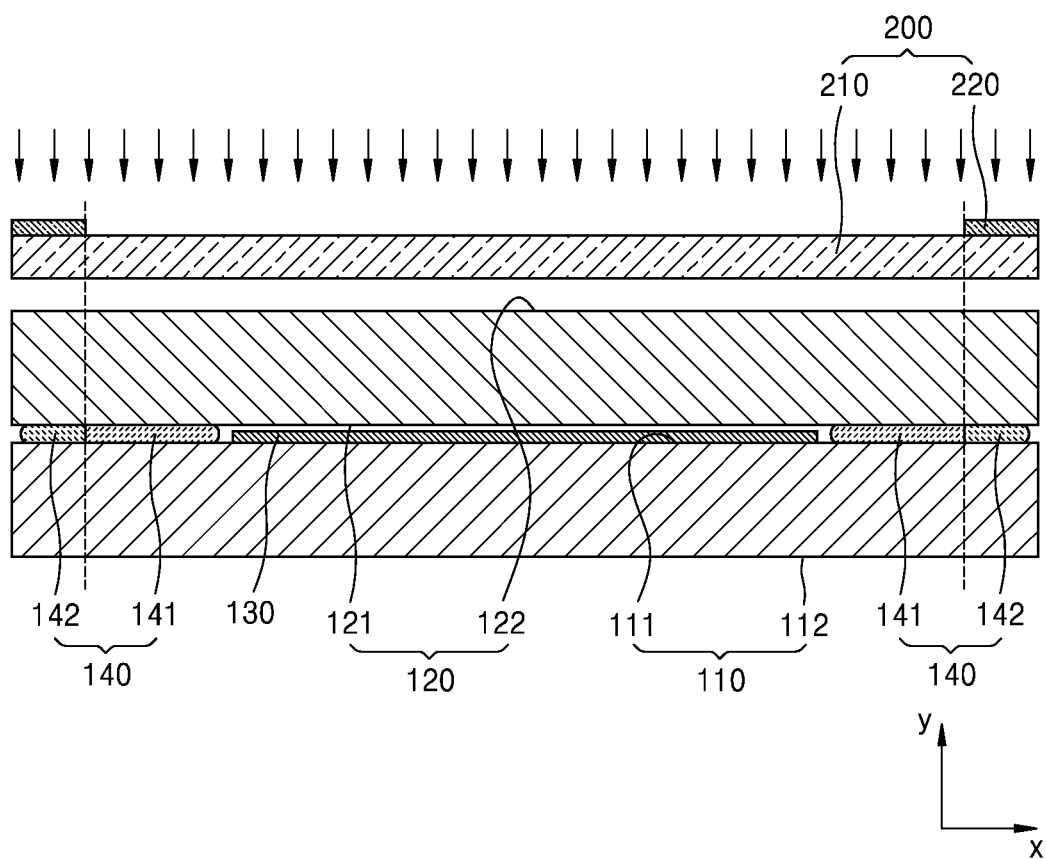

If the second substrate 120 does not have the second constant region CR2, the side surface of the second substrate 120 may only include the second increasing side surface 120a that is convex, and not include the second constant side surface 120b. In this case, an angle formed by the second increasing side surface 120a and the second external surface 122 at a region where the second increasing side surface 120a and the second external surface 122 contact each other is obtuse, and thus a boundary in the region where the second increasing side surface 120a and the second external surface 122 contact each other may not be clear. Accordingly, when a film is attached to the second external surface 122, it is difficult to specify an edge of the second external surface 122 where the film is to be attached, and thus the film may not be attached to an accurate location A method of easily cutting the first and second substrates 110 and 120 will now be described in detail with reference to FIGS. 3 through 6. After bonding the first and second substrates 110 and 120 as described above with reference to FIG. 2, a region of the combining or adhesive member 140 is exposed to light beams (for example, laser beams) as shown in FIG. 3. In detail, only the region 141 of the combining member 140 is exposed. The region 141 may be exposed via any one of various methods, and for example, using a photo mask 200. The photo mask 200 has a blocking unit 220 formed on a partial region thereof and a light transmission or penetration portion 210 as shown in FIG. 3. The photo mask 200 is located such that the blocking unit 220 corresponds to the region 142 of the combining member 140 and the light transmission portion 210 corresponds to the region 141 of the combining member 140, and then a laser beam may be irradiated to the combining member 140. The laser beam may have power of 50 to 60 watts and uniformity of 90 to 95%. Irradiating the laser beams to the portion 141 of the adhesive member 140, for example, formed of glass frit, cause the portion 141 to melt and then be cured. Thus, the adhesive member 140 may include a cured portion 141 and an uncured portion 142.

Figure 4:
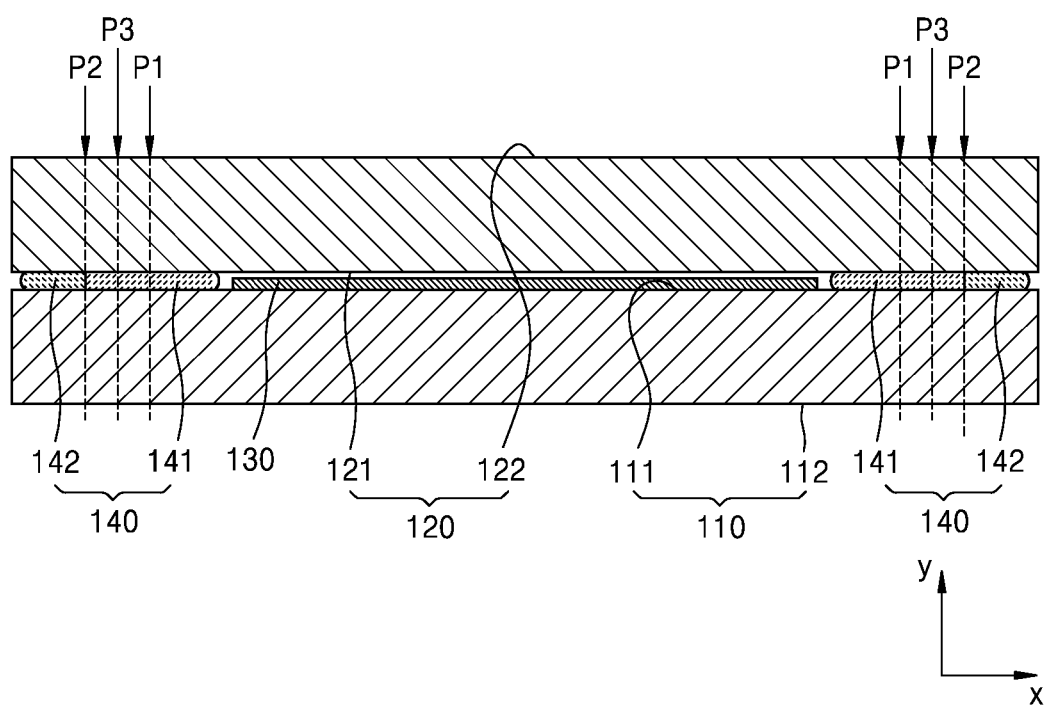

Subsequently, the first and second substrates 110 and 120 are cut at a cutting point in regions of the first external surface 112 and the second external surface 122 which correspond to the combining member 140. The cutting point is closer to the display unit 130 than a location (a second point P2 of FIG. 4) between the exposed region 141 of the combining member 140 and an unexposed region 142 of the combining member 140. Referring to FIG. 4, for example, the first and second substrates 110 and 120 may be cut from locations on the first and second external surfaces 112 and 122, which correspond to the second point P2 or a third point P3 of the combining member 140.

Figure 5:
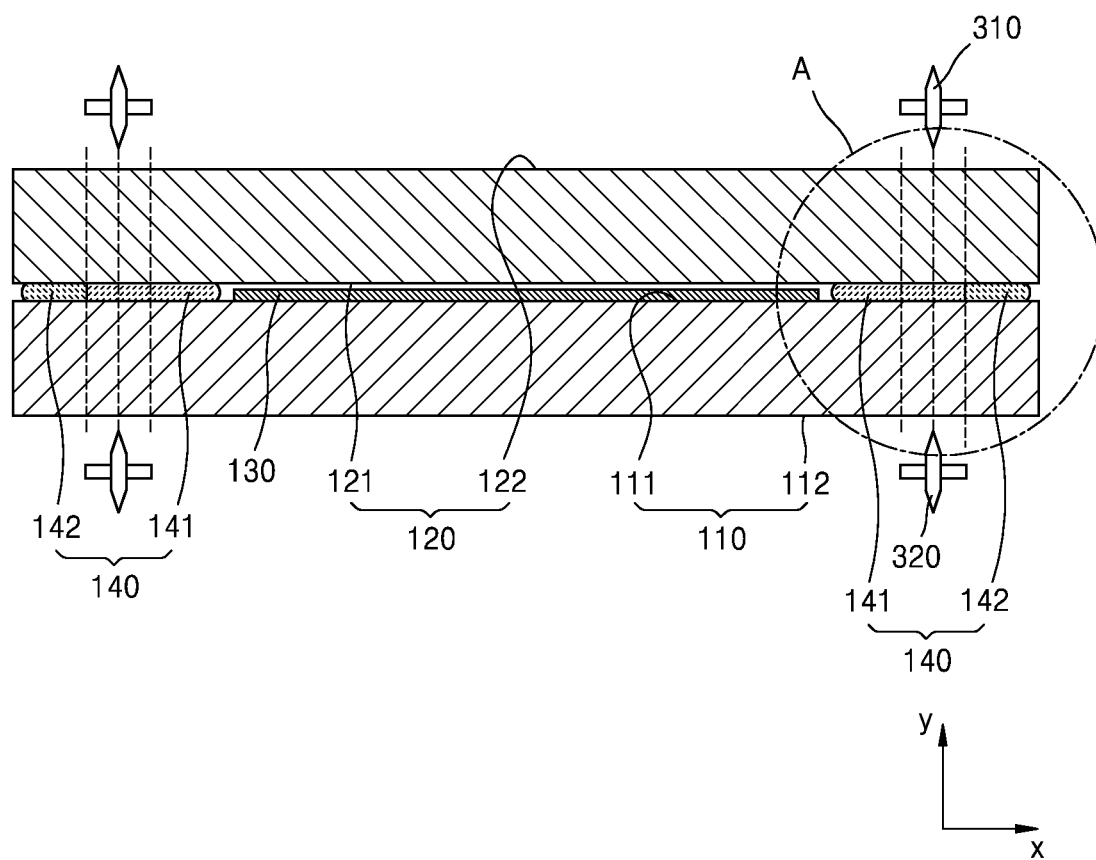

Such a point where the cutting starts will now be described in detail. A center of the region 141 of the combining member 140 may be defined as a first point P1, the boundary between the exposed region 141 of the combining member 140 and the unexposed region 142 of the combining member 140, may be defined as the second point P2, and a center between the first and second points P1 and P2 may be defined as the third point P3. In this case, the cutting point where the cutting starts may be locations on the first and second substrates 110 and 120, which correspond to the third point P3, or locations on the first and second substrates 110 and 120, which are between the second and third points P2 and P3. In FIG. 5, the first and second substrates 110 and 120 are cut from locations corresponding to the third point P3 by using cutting wheels 310 and 320.

Figure 6:
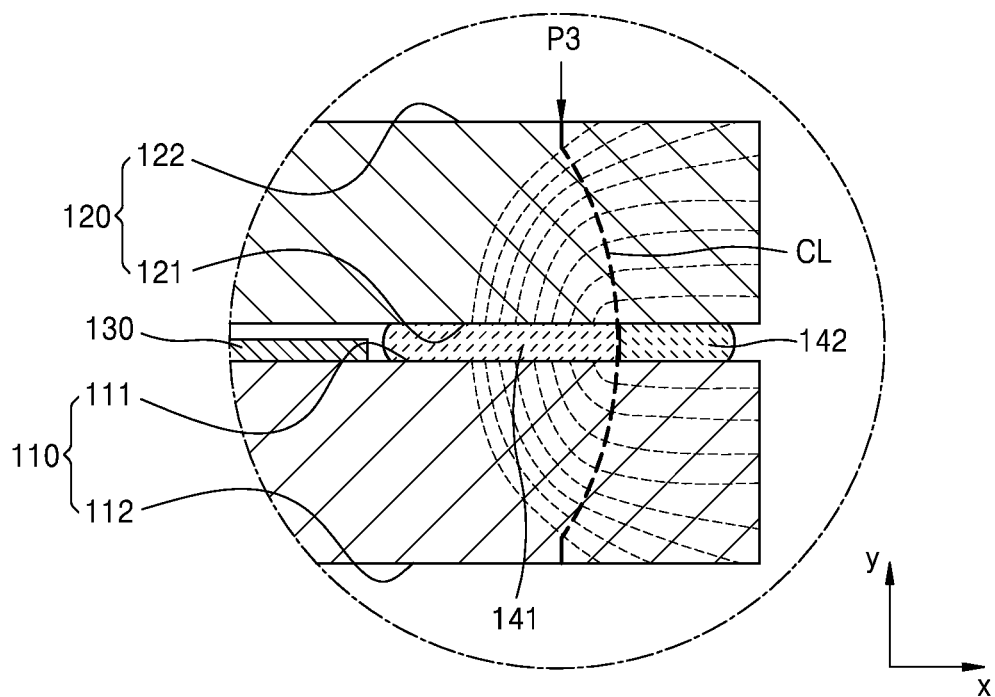

FIG. 6 is an enlarged cross-sectional view of a region A of FIG. 5, and illustrates internal stress generated by the combining member 140 in the first and second substrates 110 and 120. In FIG. 6, thin dashed lines indicate the internal stress and thick dashed lines indicate a cutting line CL. As described above with reference to FIG. 3, when only the region 141 of the combining member 140 is exposed to light beams and cured, the region 141 applies stress to the first and second substrates 110 and 120, but the region 142 that is not exposed only contacts the first and second substrates 110 and 120 and does not apply stress to the first and second substrates 110 and 120 because, when the region 141 is cured after being exposed, the volume of the region 141 is reduced and thus stress is applied to the first and second substrates 110 and 120, but the region 142 does not go through such processes. Accordingly, the internal stress is distributed in the first and second substrates 110 and 120 as shown in the thin dashed lines in FIG. 6.

Under such circumstances, when the cutting starts from, for example, locations on the first and second substrates 110 and 120, which correspond to the third point P3 of the combining member 140, by using the cutting wheels 310 and 320, as shown in FIG. 5, the vicinities of the first external surface 112 of the first substrate 110 and the second external surface 122 of the second substrate 120 are cut first. Accordingly, the first constant side surface 110b (refer to FIG. 8) of the first substrate 110 and the second constant side surface 120b (refer to FIG. 8) of the second substrate 120 are formed.

At this time, the first and second substrates 110 and 120 are naturally or spontaneously cut along the cutting line CL of FIG. 6 such that the side surfaces of the first and second substrates 110 and 120 are convex according to the internal stress of the first and second substrates 110 and 120 formed by the stress applied by the region 141 to the first and second substrates 110 and 120, and thus the side surfaces of the first and second substrates 110 and 120 are convex as shown in FIGS. 7 and 8. The cutting line CL may pass through a boundary between the region 141 and the region 142 of the combining member 140 as shown in FIG. 6 because the region 141 is located on a side near to the display unit 130 with respect to the cutting line CL since the region 141 combines the first and second substrate 110 and 120, and the region 142 is located on a side distant from the display unit 130 with respect to the cutting line CL since the region 142 only contacts the first and second substrates 110 and 120 and does not combine the first and second substrate 110 and 120.

If the first and second substrates 110 and 120 are not naturally or spontaneously cut despite the first constant side surface 110b (refer to FIG. 8) and the second constant side surface 120b (refer to FIG. 8) are formed, slight force or a slight impact may be applied to the first substrate 110 and/or the second substrate 120 such that the side surfaces of the first and second substrates 110 and 120 are naturally cut along the cutting line CL of FIG. 6 to be convex. For reference, with respect to the cutting line CL of FIG. 6, regions excluding those approximately perpendicular to the first external surface 112 of the first substrate 110 and the second external surface 122 of the second substrate 120 may be understood to be approximately perpendicular to the internal stress (the thin dashed lines in FIG. 6) formed in the first and second substrates 110 and 120. In the illustrated embodiments, the first and second substrates 110 and 120 may be cut without further advancing the cutting wheels beyond the constant regions CR1 and CR2 toward the adhesive member 140.

When the first constant side surface 110b (refer to FIG. 8) and the second constant side surface 120b (refer to FIG. 8) are respectively formed in the first and second substrates 110 and 120, the first external surface 112 of the first substrate 110 and the second external surface 122 of the second substrate 120 may be simultaneously cut inward by respectively using the cutting wheels 320 and 310.

As described above, with respect to the cutting line CL of FIG. 6, the first and second substrates 110 and 120 are naturally or spontaneously cut according to the internal stress of the first and second substrates 110 and 120 along the regions excluding those approximately perpendicular to the first external surface 112 of the first substrate 110 and the second external surface 122 of the second substrate 120. If the first constant side surface 110b (refer to FIG. 8) of the first substrate 110 is formed first and the second constant side surface 120b (refer to FIG. 8) of the second substrate 120 is formed later, the first and second substrates 110 and 120 may start to be cut by the internal stress at the moment when the first constant side surface 110b (refer to FIG. 8) of the first substrate 110 is formed. In this case, the second constant side surface 120b (refer to FIG. 8) of the second substrate 120, which is approximately perpendicular to the second external surface 122 of the second substrate 120, may not be properly formed. Accordingly, the first external surface 112 of the first substrate 110 and the second external surface 122 of the second substrate 120 may be simultaneously cut inward by respectively using the cutting wheels 320 and 310, so as to form the first constant side surface 110b (refer to FIG. 8) and the second constant side surface 120b (refer to FIG. 8).

Meanwhile, in the display apparatus manufactured as such, a radius of curvature of an inner surface 141b of the region 141 and a radius of curvature of an outer surface 141a of the region 141 may be different, as shown in FIG. 8. In detail, the radius of curvature of the inner surface 141b may be smaller than the radius of curvature of the outer surface 141a.

As described above, while locating the combining member 140 and combining the first and second substrates 110 and 120, the side surface of the combining member 140 becomes convex as shown in FIG. 2. Accordingly, in the region 141 of the combining member 140 of FIG. 8, the inner surface 141b maintains to be convex.

Meanwhile, as shown in FIGS. 5 and 6, when the combining member 140 is exposed and then the first and second substrates 110 and 120 are cut, the combining member 140 is cut near the boundary between the regions 141 and 142 while being cut along the cutting line CL. At this time, as shown in FIG. 8, the first increasing side surface 110a of the first substrate 110, which is the side surface of the first increasing region IR1, the outer surface 141a of the region 141, and the second increasing side surface 120a of the second substrate 120, which is the side surface of the second increasing region IR2, form a convex surface, and in detail, such a convex surface is continuous. Here, the outer surface 141a of the region 141 is near a vertex of the convex surface, and thus a radius of curvature of the outer surface 141a is larger than a radius of curvature of the inner surface 141b.

Figure 9:
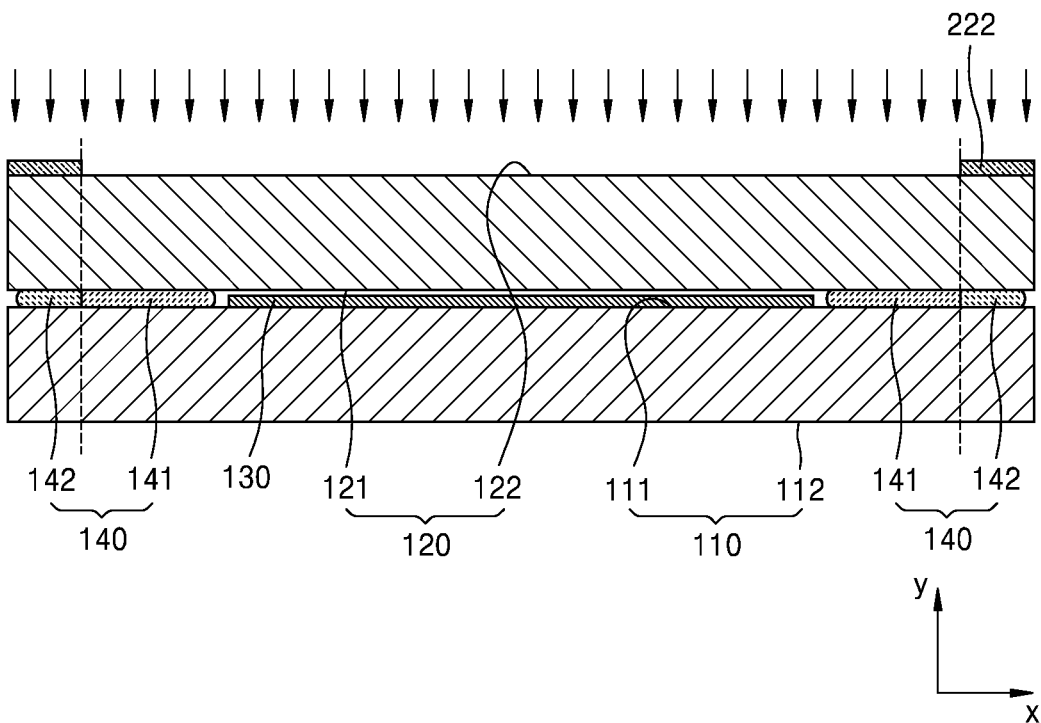
FIG. 9 is a cross-sectional view for describing a process of a method of manufacturing a display apparatus, according to another embodiment.

FIG. 9 is a cross-sectional view for describing a process of a method of manufacturing a display apparatus, according to another embodiment. According to the method described above, when a region of the combining member 140 is exposed to light beams, the photo mask 200 in which the blocking unit 220 is formed on a partial region as shown in FIG. 3 is used. However, according to the method of the current embodiment, a blocking pattern 222 formed on the second external surface 122 of the second substrate 120 as shown in FIG. 9 is used instead of the photo mask 200. As shown in FIG. 9, the blocking pattern 222 may correspond to the region 142 of the combining member 140 instead of the region 141. The blocking pattern 222 may prevent a laser beam from irradiating on the region 142 of the combining member 140.

While manufacturing the display apparatus, the display apparatus having a touch screen function may be manufactured. In order to realize the touch screen function, a touch screen conductive pattern is formed on the second external surface 122 of the second substrate 120, and by simultaneously forming the blocking pattern 222 and the touch screen conductive pattern, the blocking pattern 222 may be naturally formed without having to perform an additional operation. Of course, when the first and second substrates 110 and 120 are cut later, the blocking pattern 222 may be removed from the display apparatus.

The touch screen conductive pattern or the blocking pattern 222 may be formed on the second external surface 122 of the second substrate 120 before bonding the second substrate 120 to the first substrate 110.

Figure 10:
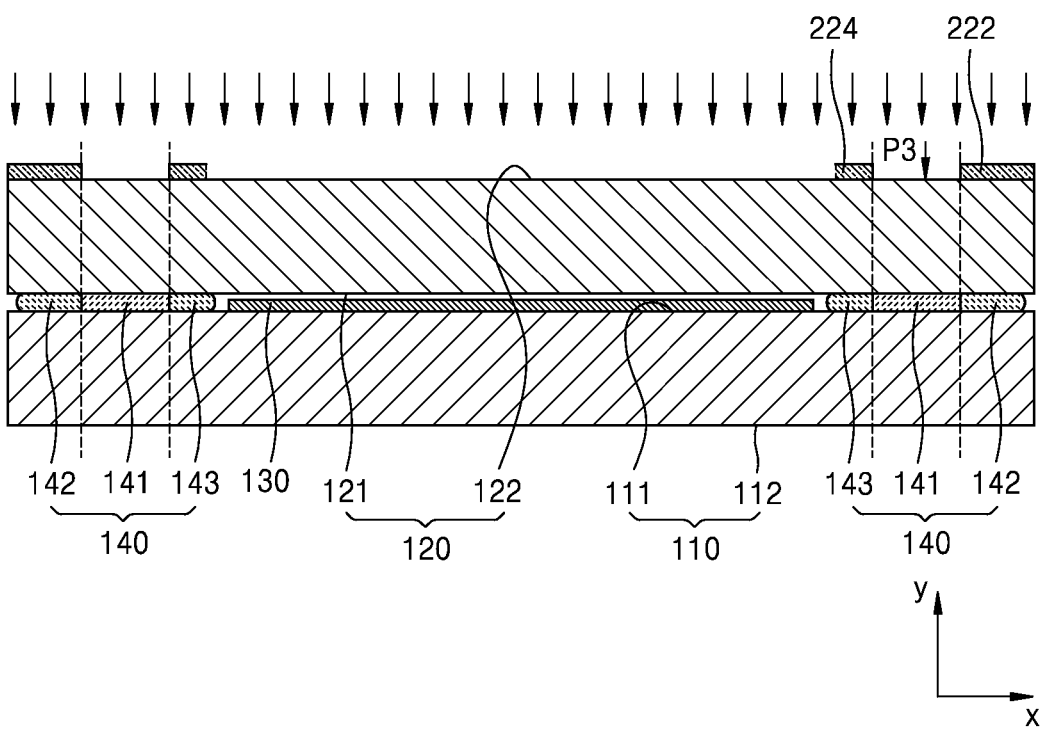
FIG. 10 is a cross-sectional view for describing a process of a method of manufacturing a display apparatus, according to another embodiment.

FIG. 10 is a cross-sectional view for describing a process of a method of manufacturing a display apparatus, according to another embodiment.

According to the methods described above with reference to FIGS. 3 and 9, when a region of the combining member 140 is exposed, only the region 141 of the combining member 140 is exposed. However, an embodiment is not limited thereto. For example, as shown in FIG. 10, when a touch screen conductive pattern 224 exists on the second external surface 122 of the second substrate 120, as well as the blocking pattern 222, the touch screen conductive pattern 224 may block a laser beam like the blocking pattern 222. Accordingly, only the region 141 excluding two regions 142 and 143 at edges of the combining member 140 may be exposed to a laser beam. For reference, FIG. 10 illustrates only a part of the touch screen conductive pattern 224.

In this case, the first and second substrates 110 and 120 are cut from locations corresponding to the third point P3 adjacent to the display unit 130 than a boundary between the exposed region 141 of the combining member 140 and the unexposed region 142 of the combining member 140 which is far from the display unit 130 from among the regions 142 and 143, in regions of the first and second external surfaces 112 and 122, which correspond to the combining member 140.

Figure 11:
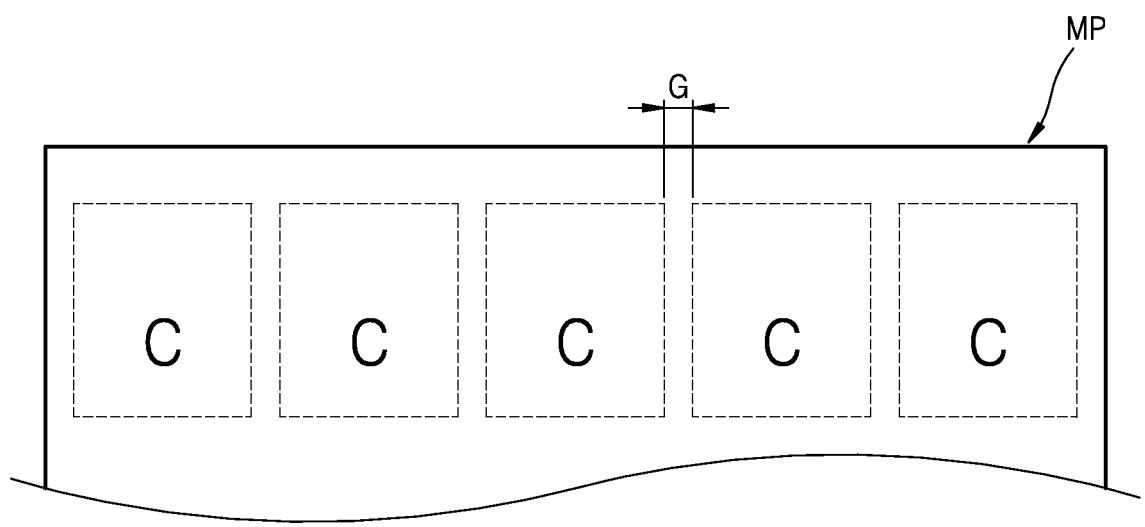
FIGS. 11 and 12 are respectively a plan view and a cross-sectional view for describing a process of method of manufacturing a display apparatus, according to another embodiment.
Figure 12:
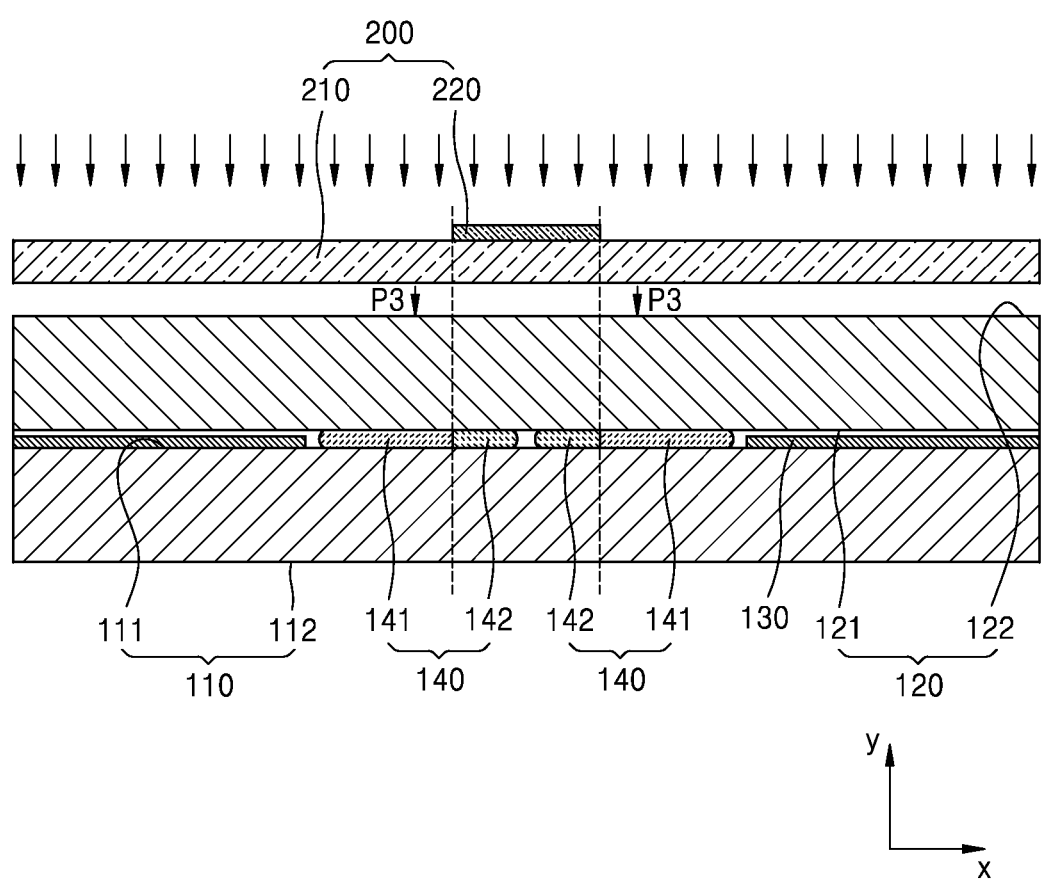

FIGS. 11 and 12 are respectively a plan view and a cross-sectional view for describing a process of method of manufacturing a display apparatus, according to another embodiment. Hereinabove, one display apparatus is manufactured, but an embodiment is not limited thereto. For example, as shown in FIG. 11, a plurality of display cells C may be simultaneously manufactured to manufacture a plurality of display apparatuses.

For example, a mother panel MP shown in FIG. 11 may be formed by forming a plurality of display units spaced apart on the first substrate 110, and combining the first and second substrates 110 and 120 by using the combining member 140. Here, the combining member 140 may surround each of the plurality of display units. In FIG. 11, dashed lines around the display cells C show regions where the combining member 140 is located. Next, as shown in FIG. 12, a region of the combining member 140 may be exposed. FIG. 12 is a cross-sectional view of a region of two adjacent display cells of FIG. 11. Then, when parts of the first and second substrates 110 and 120 are cut, by using a cutting wheel, from regions of the first and second substrates 110 and 120, which correspond to the region 141 of the combining member 140, for example, from the third point P3 of FIG. 12, the plurality of display apparatuses having convex side surfaces may be manufactured.

According to a general method of manufacturing a display apparatus, the combining member 140 is entirely exposed, and then the first and second substrates 110 and 120 are cut from a center region between the adjacent display cells C, i.e., from a center region between the combining members 140 of the adjacent display cells C. Accordingly, a gap G between the adjacent display cells C needs to be sufficiently maintained to obtain a cut location, and thus the number of display cells C simultaneously formed on the mother panel MP is limited.

However, according to the method of the current embodiment, while cutting the first and second substrates 110 and 120, the first and second substrates 110 and 120 are cut on the combining member 140 along the dashed lines instead of between the display cells C. Accordingly, the gap G between the display cells C may be reduced, and thus the number of display cells C simultaneously formed on the mother panel MP may be increased, thereby remarkably reducing expenses and time for manufacturing the display apparatuses.

Figure 13:
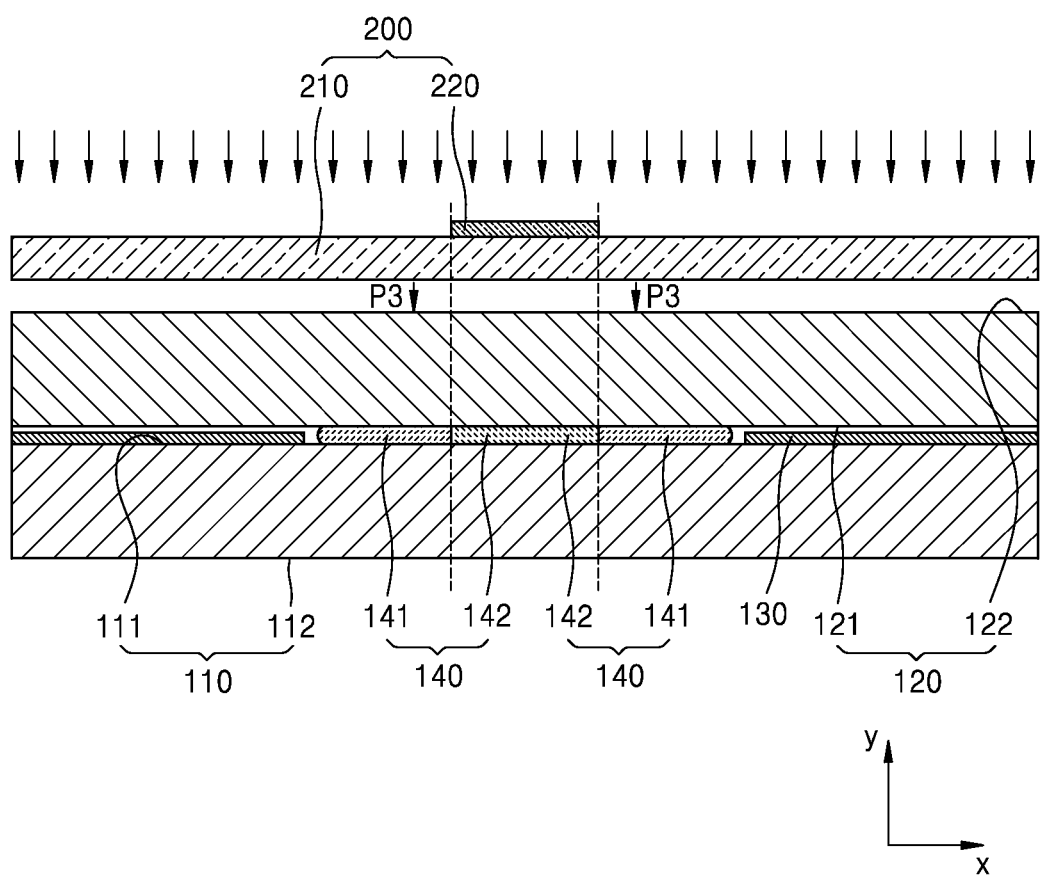
FIG. 13 is a cross-sectional view for describing a process of a method of manufacturing a display apparatus, according to another embodiment.

Meanwhile, in FIGS. 11 and 12, the adjacent display cells C individually include the combining member 140, but an embodiment is not limited thereto. For example, FIG. 13 is a cross-sectional view for describing a process of a method of manufacturing a display apparatus, according to another embodiment. As shown in FIG. 13, the adjacent display cells C may share the combining member 140. In this case, when the combining member 140 is exposed to light beams by using the photo mask 200 in which the blocking unit 220 is formed on the partial region, only the region 141 of the combining member 140 may be exposed. In this case, the photo mask 200 may be located so that the blocking unit 220 may correspond to a center region of the combining member 140. Then, a plurality of display apparatuses having convex side surfaces may be manufactured by cutting parts of the first and second substrates 110 and 120 by using a cutting wheel, from regions of the first and second substrates 110 and 120, which correspond to the region 141 of the combining member 140, for example, from the third point P3 of FIG. 13.

Of course, as modified examples of the methods described above with reference to FIGS. 12 and 13, the plurality of display apparatuses may be manufactured by forming a blocking pattern corresponding to the blocking unit 220 of the photo mask 200 on the second external surface 122 of the second substrate 120, instead of using the photo mask 200.

The methods of manufacturing a display apparatus have been described above, but embodiments are not limited thereto, and a display apparatus may also be within the scope of the present invention.

A display apparatus according to an embodiment may have a structure shown in FIG. 7 and FIG. 8 that is the enlarged cross-sectional view of the region B of FIG. 7. In embodiments, the display apparatus may include the first substrate 110, the second substrate 120, and the display unit 130 disposed between the first and second substrates 110 and 120. Here, the first substrate 110 may have the first constant region CR1 having a uniform width and the first increasing region IR1 having an increasing width, in the direction (the +y direction) from the first external surface 112 to the first internal surface 111. Also, the second substrate 120 may have the second constant region CR2 having a uniform width and the second increasing region IR2 having an increasing width, in the direction (the −y direction) from the second external surface 122 to the second internal surface 121.

The display apparatus according to the current embodiment has a side surface that is convex overall as shown in FIGS. 7 and 8. When the side surface is convex as such, a probability of the display apparatus being damaged by an external impact is low compared to when the side surface is flat and perpendicular to the first or second external surface 112 or 122. When the side surface of the display apparatus is convex overall, an effect as if the display apparatus has an arch structure is displayed, and thus impact resistance, in detail, strength with respect to a side impact, is increased. Accordingly, the display apparatus having excellent impact resistance is realized.

At this time, with respect to a thickness of the first substrate 110 in the +y direction, a region occupied by the first constant region CR1 may be smaller than a region occupied by the first increasing region IR1. For example, with respect to the thickness of the first substrate 110 in the +y direction, the region occupied by the first constant region CR1 may be smaller than or equal to ½ of the region occupied by the first increasing region IR1. Similarly, with respect to a thickness of the second substrate 120 in the +y direction, a region occupied by the second constant region CR2 may be smaller than or equal to ½ of the region occupied by the second increasing region IR2.

Meanwhile, as shown in FIGS. 7 and 8, in the display apparatus according to the current embodiment, the first substrate 110 has the first constant region CR1 in which the region of the first substrate 110, which corresponds to the display unit 130, has the uniform width in the direction (the +y direction) from the first external surface 112 to the first internal surface 111. Accordingly, in the first constant region CR1, the first external surface 112 and the first constant side surface 110b of the first substrate 110 are approximately perpendicular to each other, and as a result, a boundary is clear between the first external surface 112 and the first constant side surface 110b of the first substrate 110. Accordingly, a region of the first external surface 112 of the first substrate 110 is clear, and thus when a functional film, such as a reflection prevention film, a temporary protection film, or a polarization film, is attached on the first external surface 112 of the first substrate 110, the functional film may cover all of the first external surface 112 while not covering the side surface, i.e., the first constant side surface 110b of the first substrate 110.

If the first substrate 110 does not have the first constant region CR1, the side surface of the first substrate 110 may only include the first increasing side surface 110a that is convex, and not include the first constant side surface 110b. In this case, an angle formed by the first increasing side surface 110a and the first external surface 112 at a region where the first increasing side surface 110a and the first external surface 112 contact each other is obtuse, and thus a boundary in the region where the first increasing side surface 110a and the first external surface 112 contact each other may not be clear. Accordingly, when a film is attached to the first external surface 112, it is difficult to specify an edge of the first external surface 112 where the film is to be attached, and thus the film may not be attached to an accurate location. The same is applied to the second substrate 120.

Meanwhile, as shown in FIGS. 7 and 8, the display apparatus according to the current embodiment may further include the combining member 140 that combines the first and second substrates 110 and 120 by being located between the edge of the first internal surface 111 and the edge of the second internal surface 121. At this time, a radius of curvature of the inner surface 141b of the region 141 and a radius of curvature of the outer surface 141a of the region 141 may be different from each other. In detail, the radius of curvature of the inner surface 141b may be smaller than the radius of curvature of the outer surface 141a, and details thereof have been described above with reference to the method of manufacturing the display apparatus.

Regarding the side surface of the display apparatus, the first increasing side surface 110a of the first substrate 110, which is the side surface of the first increasing region IR1, the outer surface 141a of the region 141, and the second increasing side surface 120a of the second substrate 120, which is the side surface of the second increasing region IR2, form a convex surface, and in detail, such a convex surface is continuous. Here, the outer surface 141a of the region 141 is near a vertex of the convex surface.

The display apparatus according to an embodiment may further include a film that covers at least one of the first external surface 112 of the first substrate 110 and the second external surface 122 of the second substrate 120, while not covering a side surface. Accordingly, the film may be accurately located as described above.

According to the one or more embodiments described above, a display apparatus that is easily manufactured and has increased impact resistance, and a method of manufacturing the display apparatus may be realized.

While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
    providing an intermediate product comprising:
        a first substrate comprising a first external surface and a first internal surface;
        a second substrate comprising a second external surface and a second internal surface;
        a display unit comprising an array of pixels disposed between the first substrate and the second substrate; and
        an adhesive member located between the first internal surface of the first substrate and the second internal surface of the second substrate to surround the display unit and combining the first and second substrates together; and
    cutting the intermediate product to make a final product, wherein, in the final product, the first substrate comprises a first side connecting the first external surface and the first internal surface, wherein, in a cross section perpendicular to the first external surface, the first side comprises a first straight region and a first curved region located between the first straight region and the first internal surface, where at least a portion of the first curved region is farther from the display unit than the first straight region when viewed in a viewing direction perpendicular to the first external surface, and further such that the second substrate comprises a second side connecting the second external surface and the second internal surface, wherein, in the cross section, the second side comprises a second straight region and a second curved region located between the second straight region and the second internal surface, where at least a portion of the second curved region is farther from the display unit than the second straight region when viewed in the viewing direction perpendicular to the first external surface.

2. The method of claim 1, further comprising irradiating light beams to a part of the adhesive member prior to cutting the intermediate product, such that after curing the adhesive member, the adhesive member comprises a cured portion and an uncured portion, the cured portion being disposed between the display unit and the uncured portion.

3. The method of claim 2, wherein cutting comprises moving a first cutter to contact the first substrate at a first cutting point on the first external surface, the first cutting point being located between an outermost end of the cured portion and the display unit when viewed in a viewing direction perpendicular to the first external surface.

4. The method of claim 3, wherein, when a center of the cured portion is defined between the outermost end and an innermost end of the cured portion, the first cutting point is located between the outermost end and the center of the cured portion.

5. The method of claim 3, wherein cutting further comprises moving a second cutter to contact the second substrate at a second cutting point on the second external surface, the second cutting point being located between the outermost end of the cured portion and the display unit when viewed in a viewing direction perpendicular to the second external surface.

6. The method of claim 2, further comprising forming a conductive pattern for a touch screen and a blocking pattern over the second external surface of the second substrate,
    wherein the blocking pattern blocks the light beams not to reach the other part of the adhesive member while irradiating the light beams to form the uncured portion of the adhesive member.

7. The method of claim 6, wherein the uncured portion of the adhesive member and the blocking pattern are removed while cutting the intermediate product.

8. The method of claim 1, further comprising adhering a film covering at least one of the first external surface of the first substrate and the second external surface of the second substrate while not covering side surfaces of the first substrate and the second substrate.

9. The method of claim 1, wherein the first curved region and the second curved region are cut approximately perpendicular to lines of internal stress in the first substrate and the second substrate, respectively.

10. A method of manufacturing a display apparatus, the method comprising:
providing an intermediate product comprising:
a first substrate comprising a first external surface and a first internal surface;
a second substrate comprising a second external surface and a second internal surface;
a display unit comprising an array of pixels between the first substrate and the second substrate; and
an adhesive member located between the first internal surface of the first substrate and the second internal surface of the second substrate to surround the display unit and combining the first and second substrates together;
irradiating light beams to a part of the adhesive member so that the adhesive member comprises a cured portion and an uncured portion, the cured portion being between the display unit and the uncured portion; and
cutting the intermediate product to make a final product by:
moving a first cutter to contact the first substrate at a first cutting point on the first external surface, the first cutting point being located between an outermost end of the cured portion and the display unit when viewed in a viewing direction perpendicular to the first external surface, and
advancing the first cutter in a thickness direction of the first substrate toward the first internal surface only a first distance which is smaller than a thickness of the first substrate, such that a remaining portion of the first substrate is cut without further advancing the first cutter in the thickness direction of the first substrate toward the first internal surface,
wherein, in the final product, the first substrate comprises a first side connecting the first external surface and the first internal surface, wherein, in a cross section perpendicular to the first external surface, the first side comprises a first straight region and a first curved region located between the first straight region and the first internal surface.

11. A method of manufacturing a display apparatus, the method comprising:
providing an intermediate product comprising:
a first substrate comprising a first external surface and a first internal surface;
a second substrate comprising a second external surface and a second internal surface;
a display unit comprising an array of pixels between the first substrate and the second substrate; and
an adhesive member located between the first internal surface of the first substrate and the second internal surface of the second substrate to surround the display unit and combining the first and second substrates together;
irradiating light beams to a part of the adhesive member so that the adhesive member comprises a cured portion and an uncured portion, the cured portion being between the display unit and the uncured portion; and
cutting the intermediate product to make a final product by:
moving a first cutter to contact the first substrate at a first cutting point on the first external surface, the first cutting point being located between an outermost end of the cured portion and the display unit when viewed in a viewing direction perpendicular to the first external surface,
advancing the first cutter in a thickness direction of the first substrate toward the first internal surface only a first distance which is smaller than a thickness of the first substrate,
moving a second cutter to contact the second substrate at a second cutting point on the second external surface, the second cutting point being located between the outermost end of the cured portion and the display unit when viewed in a viewing direction perpendicular to the second external surface, and
advancing the second cutter in a thickness direction of the second substrate toward the second internal surface only a second distance which is smaller than a thickness of the second substrate,
wherein remaining portions of the first and second substrates are cut without further advancing the first and second cutters toward the first and second interior internal surfaces, respectively, and
wherein, in the final product, the first substrate comprises a first side connecting the first external surface and the first internal surface, wherein, in a cross section perpendicular to the first external surface, the first side comprises a first straight region and a first curved region located between the first straight region and the first internal surface, and further such that the second substrate comprises a second side connecting the second external surface and the second internal surface, wherein, in the cross section, the second side comprises a second straight region and a second curved region located between the second straight region and the second internal surface.

12. The method of claim 11, wherein the remaining portions of the first and second substrates are spontaneously cut or the remaining portions of the first and second substrates are cut by applying a force to the first or second substrate.

13. The method of claim 11, wherein cutting further comprises transferring the first cutter along a first predetermined line along the first external surface and transferring the second cutter along a second predetermined line along the second external surface after advancing the first and second cutters, wherein the first and second predetermined lines overlap the cured portion of the adhesive member.

* * * * *